(12) United States Patent
Lee et al.

(10) Patent No.: US 7,758,716 B2
(45) Date of Patent: Jul. 20, 2010

(54) APPARATUS FOR SPRAYING ETCHANT SOLUTION ONTO PREFORMED PRINTED CIRCUIT BOARD

(75) Inventors: Wen-Chin Lee, Taoyuan (TW); Cheng-Hsien Lin, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 742 days.

(21) Appl. No.: 11/610,642

(22) Filed: Dec. 14, 2006

(65) Prior Publication Data
US 2008/0029219 A1    Feb. 7, 2008

(30) Foreign Application Priority Data
Jul. 28, 2006   (CN)   ................. 2006 1 0061858

(51) Int. Cl.
  *C23F 1/00*    (2006.01)
(52) U.S. Cl. .................. 156/345.21; 156/345.17; 134/103.2; 134/131; 134/151; 134/198; 134/902
(58) Field of Classification Search ............. 134/103.2, 134/131, 151, 198, 902; 156/345.21, 345.17
See application file for complete search history.

(56) References Cited

U.S. PATENT DOCUMENTS

| 4,174,261 A | | 11/1979 | Pellegrino | |
|---|---|---|---|---|
| 4,221,228 A | * | 9/1980 | Stoffel et al. | 134/199 |
| 4,227,938 A | * | 10/1980 | Fowler | 134/10 |
| 4,231,806 A | * | 11/1980 | Henry | 134/18 |
| 4,997,000 A | * | 3/1991 | Feast et al. | 134/170 |
| 5,205,307 A | * | 4/1993 | Di Stefano et al. | 134/104.4 |
| 5,638,843 A | * | 6/1997 | Strickland | 134/123 |
| 5,759,289 A | * | 6/1998 | Caron et al. | 134/34 |
| 5,782,252 A | * | 7/1998 | Lewis et al. | 134/103.1 |

FOREIGN PATENT DOCUMENTS

JP    290600    3/1990

\* cited by examiner

*Primary Examiner*—Sylvia R. MacArthur
(74) *Attorney, Agent, or Firm*—Jeffrey T. Knapp

(57) ABSTRACT

An apparatus (100) for spraying an etchant solution on a preformed printed circuit board (30) includes a number of feed pipes (40) for supplying the etchant solution and a number of nozzles (45) mounted on the feed pipes. Each of the feed pipes has a middle portion (402) and two end portions (401). The middle portions of the feed pipes are located on a first plane and the end portions of the feed pipes are located on a second plane parallel to the first plane. The number of nozzles are mounted on the middle portion and the two end portions of each feed pipe. The number of nozzles are in fluid communication with the feed pipes.

6 Claims, 4 Drawing Sheets

APPARATUS FOR SPRAYING ETCHANT SOLUTION ONTO PREFORMED PRINTED CIRCUIT BOARD

CROSS REFERENCE TO RELATED APPLICATION

This application is related to a commonly-assigned copending application Ser. No. 11/614,362, entitled "APPARATUS FOR SPRAYING ETCHANT AND METHOD FOR MANUFACTURING PRINTED CIRCUIT board".

BACKGROUND OF THE INVENTION

1. Field of the Invention

The present invention relates to apparatuses for spraying etchant solution and, more particularly, to an apparatus for spraying an etchant solution onto a preformed printed circuit board.

2. Description of Related Art

Recently, as the electronic appliances are becoming smaller in size and diversified in function, printed circuit boards (PCBs) widely used in such electronic appliances are required to have greater circuit density and reliability.

Usually, printed circuit boards are etched using a chemical etching process. The chemical etching process uses an apparatus to spray an etchant solution onto the preformed printed circuit boards and includes the following steps: providing a copper clad laminate (CCL); forming a photoresist layer on the copper clad laminate by screen printing or photographic methods; placing the copper clad laminate in an etching bath; conveying the copper clad laminate by a feed roller in a running direction and spraying the etchant solution evenly onto both an upper surface and a bottom surface of the copper clad laminate by a number of nozzles mounted on the apparatus for spraying the etchant solution to etch the copper uncovered by the photoresist layer so as to form the printed circuit board.

This chemical etching process is advantageous in that it is both cheap and it allows a high level of automation. However, problems can be caused by the way in which the nozzles of the apparatus for spraying the etchant solution have the same spray pressure when spraying the etchant solution onto the printed circuit board. During spraying, the sprayed etchant solution on the periphery of the printed circuit board flows off and is replaced by new etchant solution, but the sprayed etchant solution on the central portion of the printed circuit board cannot easily flow away. This leads to the sprayed etchant in the central area of the printed circuit board being inadequately replenished by the new etchant solution since the old etchant solution congregates in the central area, as a result the central area of the printed circuit board is etched unevenly.

What is needed, therefore, is an apparatus for spraying an etchant solution which can be used to uniformly etch the printed circuit board.

SUMMARY OF THE INVENTION

An apparatus for spraying an etchant solution on a preformed printed circuit board according to one preferred embodiment includes a number of feed pipes for supplying the etchant solution and a number of nozzles mounted on the feed pipes. Each of the feed pipes has a middle portion and two end portions. The middle portions of the feed pipes are located at a first plane and the end portions of the feed pipes are located at a second plane parallel to the first plane. The nozzles are mounted on the middle portion and the two end portions of each feed pipe. The nozzles are in fluid communication with the feed pipes.

An apparatus for spraying an etchant solution onto a preformed printed circuit board according to another preferred embodiment includes at least one manifold, and a plurality of feed pipes in fluid communication with the manifold. The feed pipes have a plurality of spray nozzles arranged thereon. The spray nozzles includes a plurality of first spray nozzles substantially located on a first plane, and a plurality of second spray nozzles substantially located on a second plane parallel to the first plane. The spray nozzles cooperatively constitute a spray region, and the first spray nozzles are located in the middle of the spray region.

The present apparatus uses the number of nozzles mounted on and being in fluid communication with the middle portion and the two end portions of each feed pipe to spray the etchant solution on the printed circuit board. Since the middle portions of the feed pipes are located on the first plane and the end portions of the feed pipes are located on the second plane, the spray pressure of the nozzles mounted on the middle portion is larger than that of the nozzles mounted on the end portions. The amount of the sprayed etchant in the central portion of the printed circuit board corresponding to the middle portions of the feed pipes is therefore larger and the etchant in the central portion of the printed circuit board can be properly replenished. As a result, the puddle effect can be eliminated and the printed circuit board can be etched uniformly.

Other advantages and novel features will become more apparent from the following detailed description of present apparatus, when taken in conjunction with the accompanying drawings.

BRIEF DESCRIPTION OF THE DRAWINGS

Many aspects of the present apparatus for spraying etchant solution on a preformed printed circuit board can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Reference will now be made to the drawings to describe a preferred embodiment of the present apparatus for spraying an etchant solution on a preformed printed circuit board in detail.

Figure 1:
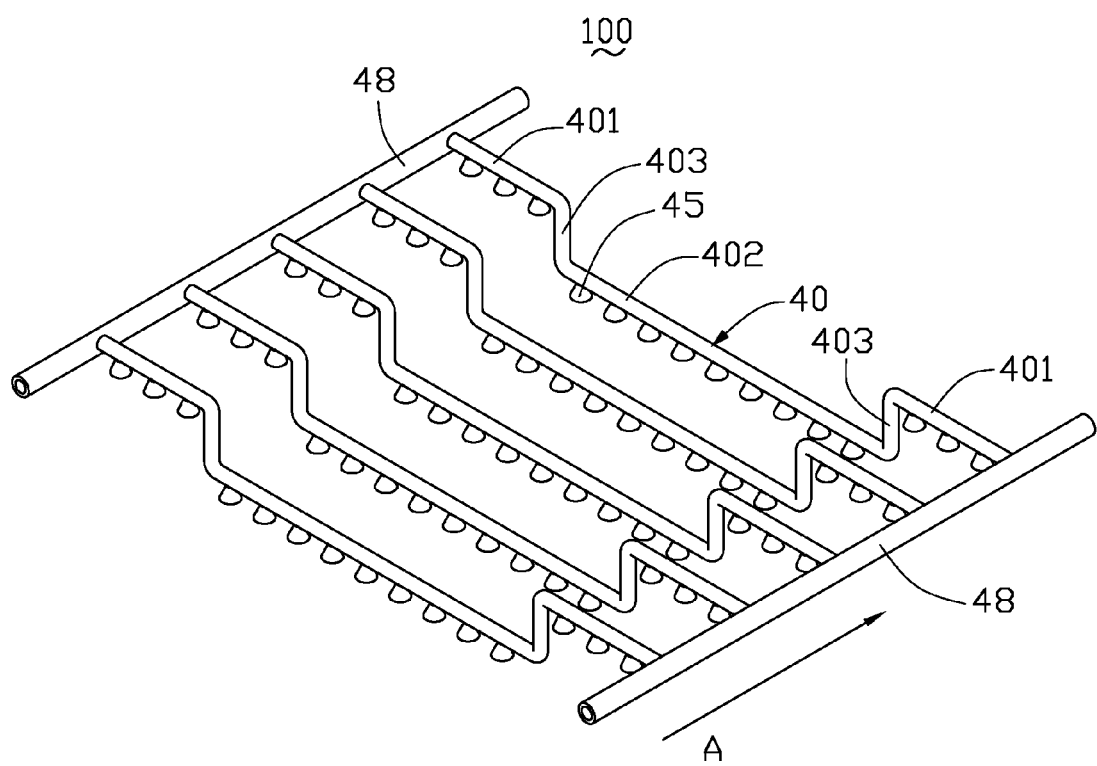
FIG. 1 is a schematic, isometric view of an apparatus for spraying an etchant solution on a preformed printed circuit board in accordance with a first preferred embodiment.
Figure 2:
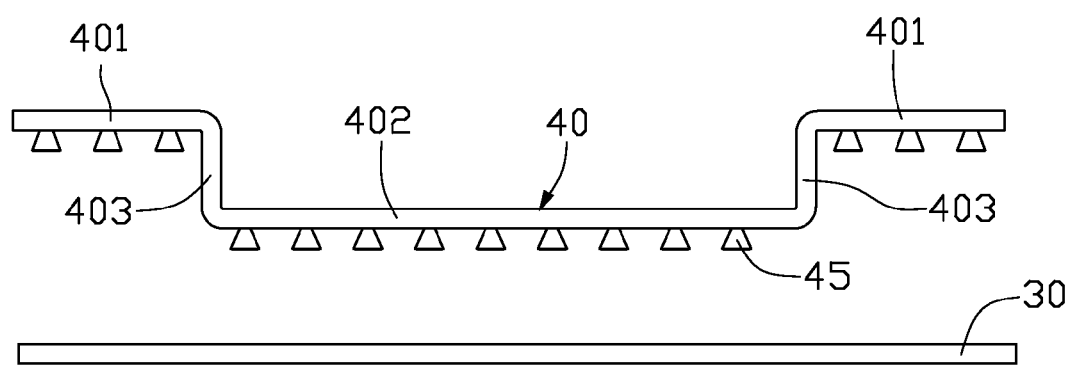
FIG. 2 is a schematic, side view of the apparatus of FIG. 1.

Referring to FIGS. 1 and 2, an apparatus 100 for spraying an etchant solution on a preformed printed circuit board 30 in accordance with a first preferred embodiment includes a number of feed pipes 40 and a number of nozzles 45 mounted on each of the feed pipes 40.

The number of feed pipes 40 are arranged parallel each other. Each of the feed pipes 40 has a middle portion 402 and two end portions 401. The middle portions 402 of the feed pipes 40 are located at a first plane, and the end portions of the feed pipes are located at a second plane parallel to the first plane. The middle portions 402 of the feed pipes 40 are positioned corresponding to a central portion 302 of the printed circuit board 30 and the end portions 401 of the feed pipes 40 are positioned corresponding to two end portions 301 of the printed circuit board 30. The middle portions 402 of the feed pipes 40 are positioned closer to the printed circuit board 30 than the end portions 401 of the feed pipes. That is, the first plane is placed closer to the printed circuit board 30 than the second plane. A first height h1 is defined perpendicularly between the middle portions 402 of the feed pipes 40 and the central portion 302 of the printed circuit board 30. A second height h2 is defined perpendicularly between the end portions 401 of the feed pipes 40 and the end portion 302 of the printed circuit board 30. The middle portions 402 of the feed pipes 40 are preferably oriented parallel with the end portions 401 thereof. The first height h1 may be approximately 30% to 50% of the second height h2. The nozzles 45 are regularly mounted on the end portions 401 and the middle portions 402 of the feed pipes 40.

Each of the feed pipes 40 further includes two joint portions 403 interconnecting the middle portion 402 and the end portions 401. In this exemplary embodiment, the two joint portions 403 are perpendicular to the middle portion 402. There is no nozzle 45 mounted on the two joint portions 403.

The spray etching apparatus 100 further includes at least one manifold 48 in fluid communication with the feed pipes 40. The at least one manifold 48 is in fluid communication with an etchant source (not shown) and supplies the etchant solution to the feed pipes 40. The at least one manifold 48 is in fluid communication with at least one of the two end portions 401 of each feed pipe 40 and supplies the etchant solution thereto. The at least one manifold 48 has a higher flow capacity than that of each feed pipe 40 so as to supply enough etchant solution to the feed pipes 40. In this exemplary embodiment, the apparatus 100 includes two manifolds 48 in fluid communication with each of the two end portions 401 of each feed pipe 40.

The nozzles 45 are distributed on the middle portions 402 and the end portions 401 of the feed pipes 40 in a predetermined pattern. In this embodiment, the nozzles 45 are evenly distributed on the middle portions 402 and end portions 401 for uniformly spraying the etchant solution onto the printed circuit board 30. The nozzles 15 mounted on the middle portions 402 and the end portions 401 are equally spaced. Alternatively, the distance between every two adjacent nozzles 45 mounted on the middle portions 402 may be less than that of nozzles mounted on the end portions 401 for spraying more etchant solution in the central portion 302 of the printed circuit board 30 thus decreasing the pooling effect.

Compared with the conventional apparatus, the present apparatus 100 uses the nozzles 45 mounted on and in fluid communication with the middle portions 402 and the end portions 401 of the feed pipes 40 to spray the etchant solution onto the printed circuit board 30. Since the middle portions 402 are closer to the printed circuit board 30 than the end portions 401, the spray pressure of the nozzles 45 mounted on the middle portion 402 is larger than that of the nozzles 45 mounted on the two end portions 401. As a result of this the amount of the sprayed etchant solution in the central portion 302 of the printed circuit board 30 corresponding to the middle portion 402 is larger and the etchant solution in the central area thereof can be replenished in time. Therefore, the pooling effect can be essentially eliminated and the printed circuit board 30 can be evenly etched. Furthermore, the distance between adjacent nozzles 45 mounted on the middle portion 402 may be less than that of nozzles on the two end portions 401, so that the sprayed etchant solution in the central portion 302 of the printed circuit board 30 may be replenished at a faster rate thus reducing the pooling effect.

Figure 3:
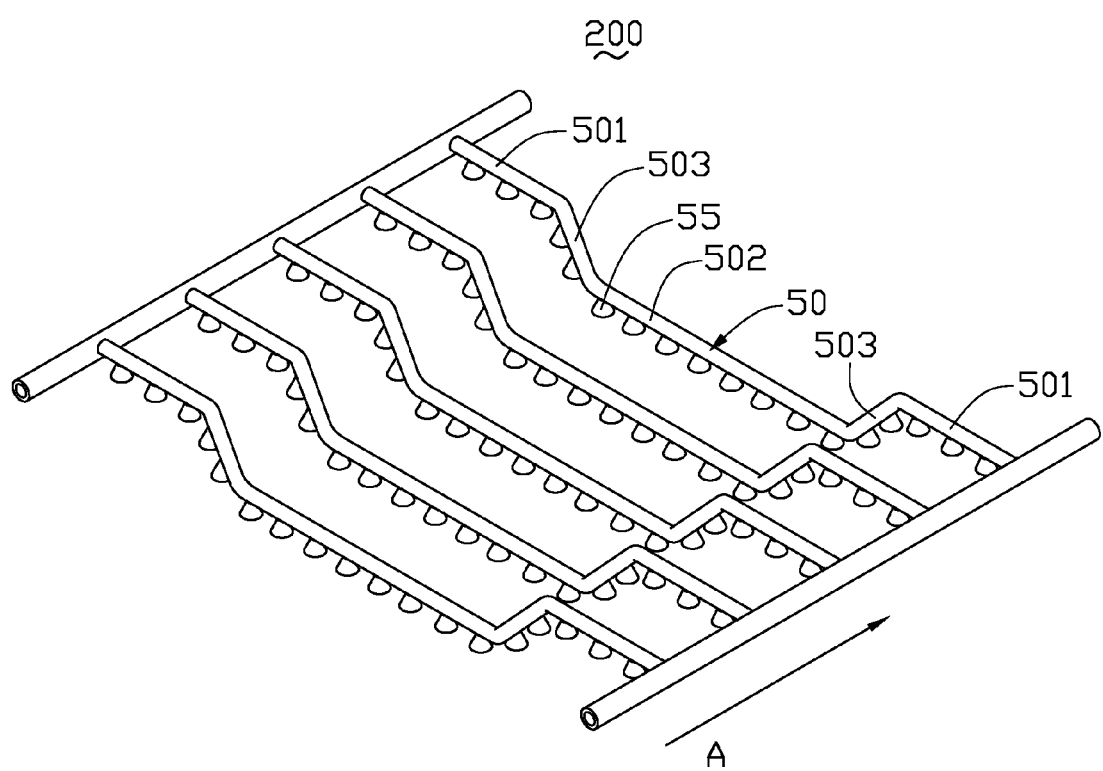
FIG. 3 is a schematic, isometric view of an apparatus for spraying an etchant solution on a preformed printed circuit board in accordance with a second preferred embodiment.
Figure 4:
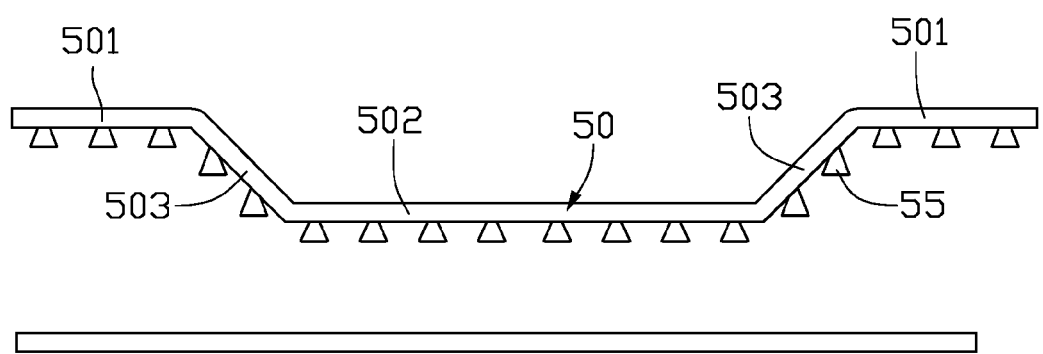
FIG. 4 is a schematic, side view of the apparatus of FIG. 3.

Referring to FIGS. 3 and 4, an apparatus 200 for spraying etchant solution onto the printed circuit board 30 in accordance with a second preferred embodiment is shown. The apparatus 200 is similar to that of the first preferred embodiment, except that the two joint portions 503 of each feed pipe 50 are not oriented perpendicular to the middle portion 502. Each of the joint portions 503 and the middle portion define an angle, and the angle is in an approximate range from 45 to 60 degrees; and each of the joint portions 503 and the corresponding end portion 501 define an angle, and the angle is in an approximate range from 45 to 60 degrees. Furthermore, a number of nozzles 55 are mounted on the two joint portions 503. The nozzles 55 can be uniformly distributed over the two joint portions 503 for spraying etchant solution onto the printed circuit board 30. Alternatively, the distance between every two adjacent nozzles 55 can gradually decrease in a direction towards the middle portion 502.

It is to be understood that the above-described embodiment is intended to illustrate rather than limit the invention. Variations may be made to the embodiment without departing from the spirit of the invention as claimed. The above-described embodiments are intended to illustrate the scope of the invention and not to restrict the scope of the invention.

What is claimed is:

1. An apparatus for spraying an etchant solution onto a preformed printed circuit board, comprising:
   a plurality of feed pipes for supplying the etchant solution, each of the feed pipes having a middle portion, two end portions, and two joint portions, the middle portions of the feed pipes being located on a first plane and the end portions of the feed pipes being located on a second plane parallel to the first plane, the two joint portions interconnecting the middle portion and the end portions; and
   a plurality of nozzles mounted on the middle portion and the two end portions of each feed pipe, the plurality of nozzles being in fluid communication with the feed pipes.

2. The apparatus as claimed in claim 1, wherein the middle portion is parallel with the two end portions.

3. The apparatus as claimed in claim 2, wherein the joint portions are oriented perpendicular to the middle portion.

4. The apparatus as claimed in claim 2, wherein each of the joint portions and the middle portion define an angle, and the angle is in an approximate range from 45 to 60 degrees; and each of the joint portions and the corresponding end portion define an angle, and the angle is in an approximate range from 45 to 60 degrees.

5. The apparatus as claimed in claim 4, wherein the two joint portions further include a plurality of nozzles mounted thereon.

6. The apparatus as claimed in claim 5, wherein a distance between adjacent nozzles gradually decreases in a direction towards the middle portion.

* * * * *